United States Patent
Kim

(10) Patent No.: US 7,291,518 B2
(45) Date of Patent: Nov. 6, 2007

(54) ELECTRONIC PACKAGE OF PHOTO-IMAGE SENSORS IN CELLULAR PHONE CAMERA MODULES, AND THE FABRICATION AND ASSEMBLY THEREOF

(75) Inventor: Deok-Hoon Kim, Tempe, AZ (US)

(73) Assignee: Optopac, Inc., Gyeonggi-do (KR)

( * ) Notice: Subject to any disclaimer, the term of this patent is extended or adjusted under 35 U.S.C. 154(b) by 349 days.

(21) Appl. No.: 11/131,271

(22) Filed: May 18, 2005

(65) Prior Publication Data

US 2005/0208702 A1 Sep. 22, 2005

Related U.S. Application Data

(60) Division of application No. 10/829,273, filed on Apr. 22, 2004, now Pat. No. 6,943,423, and a continuation-in-part of application No. 10/692,816, filed on Oct. 27, 2003, now Pat. No. 6,864,116.

(60) Provisional application No. 60/536,536, filed on Jan. 15, 2004, provisional application No. 60/507,100, filed on Oct. 1, 2003.

(51) Int. Cl.
   *H01L 21/44* (2006.01)
   *H01L 21/50* (2006.01)
   *H01L 21/00* (2006.01)

(52) U.S. Cl. .................. 438/108; 438/116; 438/64; 257/E21.499

(58) Field of Classification Search ................ 438/106, 438/116, 108, 64; 257/E21.499
See application file for complete search history.

(56) References Cited

U.S. PATENT DOCUMENTS 3,292,240 A 12/1966 McNutt et al.

(Continued)

FOREIGN PATENT DOCUMENTS

| JP | 2000-286401 | 10/2000 |
|---|---|---|
| JP | 2001-068654 | 3/2001 |
| JP | 2002-043554 | 2/2002 |
| JP | 2003-032558 | 1/2003 |
| KR | 1020020006343 | 1/2002 |
| KR | 2002-0009087 | 2/2002 |

OTHER PUBLICATIONS

Zdenek Knittl, Optics of Thin Films (an Optical Multilayer Theory), John Wiley & Sons, Ltd. Prerov., Czechoslovakia, pp. 11-21; 364-365 (1976).

(Continued)

*Primary Examiner*—Scott B. Geyer
*Assistant Examiner*—Elias Ullah
(74) *Attorney, Agent, or Firm*—Rosenberg, Klein & Lee

(57) ABSTRACT

A photo-sensing device package and the method of packaging such device is provided. The package includes an assembly portion having a substrate formed of a material substantially transparent to light within a predetermined range of wavelengths and a sensing portion having at least one photo-sensing die photo-electronically transducing light within the predetermined range of wavelengths. The assembly portion is formed with at least one metal layer disposed on the substrate about a front surface region thereof, and at least one passivation layer formed to extend over the metal layer. The passivation layer is patterned to define a plurality of first and second access openings respectively about a plurality of first solder wettable pads and at least one second solder wettable pad on the metal layer. Each of the first solder wettable pads is joined by a first solder joint to a solder bump pad formed on the sensing portion, while the second solder wettable pad is joined by a second solder joint to external circuitry.

12 Claims, 12 Drawing Sheets

U.S. PATENT DOCUMENTS

| | | |
|---|---|---|
| 5,302,778 A | 4/1994 | Maurinus |
| 5,583,076 A | 12/1996 | Yoshizawa et al. |
| 5,716,759 A | 2/1998 | Badehi |
| 6,040,235 A | 3/2000 | Badehi |
| 6,117,707 A | 9/2000 | Badehi |
| 6,441,478 B2 | 8/2002 | Park |
| 6,566,745 B1 | 5/2003 | Beyne et al. |
| 6,743,696 B2 | 6/2004 | Jeung et al. |
| 6,759,642 B2 | 7/2004 | Hoshino |
| 6,784,020 B2 * | 8/2004 | Lee et al. .................. 438/106 |
| 2001/0030276 A1 | 10/2001 | Hoshino |

OTHER PUBLICATIONS

James D. Rancourt, Optical Thin Films, Users' Handbook, Macmillan Publishing Company, New York, New York, pp. v-xi, 210-213 (1987).

H. A. Macleod, Thin-Film Optical Filters, American Elsevier Publishing Company, Inc. New York, New York, pp. ix-x; 37-42; 56-57 (1969).

O.S. Heavens, Optical Properties of Thin Solid Films, Dover Publications, Inc. New York, New York, pp. v-vii; 46-63 (1965).

* cited by examiner

ELECTRONIC PACKAGE OF PHOTO-IMAGE SENSORS IN CELLULAR PHONE CAMERA MODULES, AND THE FABRICATION AND ASSEMBLY THEREOF

This application is a Divisional patent application of application Ser. No. 10/829,273, filed on 22 Apr. 2004 now U.S. Pat. No. 6,943,423.

RELATED U.S. APPLICATION DATA

This Application is based on U.S. Provisional Patent Application Ser. No. 60/536,536, filed 15 Jan. 2004. This application is a Continuation-In-Part of U.S. Non-provisional patent application Ser. No. 10/692,816, filed 27 Oct. 2003, now U.S. Pat. No. 6,864,116 which is based on U.S. Provisional Patent Application, Ser. No. 60/507,100, filed 1 Oct. 2003.

BACKGROUND OF THE INVENTION

1. Field of the Invention

The present invention relates generally to electronic packaging of semiconductor integrated circuits, and particularly, to electronic packaging of photo-sensing semiconductor devices. More specifically, the present invention relates to electronic packaging of photo image sensors in such compact applications as cellular telephone camera modules.

2. Prior Art

FIGS. 1A, 1B illustrate top and bottom views of typical camera modules 1, 3 often employed in cellular telephones. In the smaller of the modules 3, the lens housing is removed to more clearly show the module's internal configuration. A photo-sensor 3a is provided at each module's center, and a plurality of decoupling capacitors 3b are disposed thereabout.

A popular technique employed in the fabrication of such cellular phone camera modules is currently the so-called chip-on-board (COB) technique by which a module structure illustrated in the schematic cross-sectional view of FIG. 2 is realized. For clarity, extraneous devices like decoupling capacitors are omitted from the illustrated view. As shown, the COB-formed module includes a photo-image sensor 5; a printed circuit board (PCB) 7 to which the photo-image sensor 5 is attached using epoxy; and, gold-wire conductors for interconnections between the photo-image sensor 5 and the PCB 7. The module also includes in typical applications a plurality of passive devices such as the decoupling capacitors, connected to the PCB, which are not shown in the Figure to preserve clarity. The module further includes a molded housing (or barrel) 11 that extends over the assembled PCB 7. Within this housing 7 are positioned appropriate optical lenses 13 and an infrared (IR) cut filter glass member 15.

Attached to the PCB is a flexible film member 17 in which electrical interconnection lines are run. This flexible film member 17 allows for various camera module positions and orientations without breakage of electrical connections. As shown, one end of this flexible film member 17 makes electrical connections with the PCB 7 to which it is attached, and the other end extends therefrom for connection to a controller through, for example, a connector 19. Typically, four different metal layers are employed in a PCB 7 to effect the necessary electrical interconnections. One or two separate metal layers are typically employed in a flexible film member 17, one layer for signal lines and, if necessary, an additional layer for a ground plane underneath.

One reason for the COB technique's popularity in camera module applications is its compact size. Compact size is a most important requirement in such hand-held applications. In other applications where compact size is not as important a consideration, packaged photo-image sensors are generally preferred, as they offer better protection for the photo-sensor, and are easier to assemble on a PCB using a well known surface mounting technology (SMT). Packaged photo-image sensor types include ceramic leadless chip carrier (CLCC), an epoxy laminate version of the CLCC (in which the ceramic substrate is replaced by a less expensive epoxy laminate substrate much like that used in plastic ball grid array (PBGA) packages), and plastic leadless chip carrier (PLCC)—another less expensive variation of the CLCC. Unfortunately, none of these packaged photo-sensor image types are, in practice, viable alternatives for cellular phone camera module applications because of the resulting module's excessive size.

FIG. 3 shows a schematic cross-sectional view of a typical CLCC photo-sensing device. As shown in the figure, a photo-sensing semiconductor die is mounted face-up on a ceramic substrate 4 by using epoxy or the like inside of an enclosure that is covered by a glass lid 6. Wire bonding 8 is typically used to connect the photo-sensing die 2 to the ceramic substrate 4. Solderable pads 10 are provided on the bottom of ceramic substrate 4 to connect the package to a circuit board.

Other techniques are known for those applications where even more compact size than is realizable with the COB technique is sought. One such other technique is a chip scale (or size) package (CSP) technique. This CSP technique yields a packaged device whose overall package size is comparable (equal to or slightly greater than) typical chip sizes, so that the resulting module's size after full assembly is comparable to, or even less than, that of a COB module.

A known CSP packaging approach for photo-sensing semiconductor devices is one offered by Shellcase, Inc. Detailed techniques are disclosed by U.S. Pat. Nos. 5,716, 759, 6,040,235, and 6,117,707. FIG. 4 shows a schematic cross-section of a package formed in accordance with those techniques, wherein a patterned metal layer is applied to a photo-sensing semiconductor wafer to extend bonding pads to its dicing area having a narrow width between neighboring dice. A photo-sensing wafer is attached to a glass substrate by using epoxy. After that, the backside of the wafer is ground to thin out the wafer. The silicon of the dicing area is then removed to expose metal lines. Many more process steps are needed to complete fabrication, but a detailed explanation is omitted, as such is not necessary for a clear understanding in the present invention.

The advantage of this package compared to a CLCC package is its smaller size. A number of drawbacks are nonetheless found in this package as well. Perhaps the most critical drawback with this package is the complexity both in structure and fabrication process. This complexity is a significant factor in mass production since complexity tends to increase the processing yield loss. As a result of its complexity and attendant yield loss, the package is expensive to fabricate.

Other nontrivial disadvantages of this technique include its need for a wide dicing line, which cuts against the trend in semiconductor manufacturing to decrease the width of dicing lines to achieve more dice per wafer. The current typical dicing line width of about 100 micrometers is not wide enough to support this technique. Consequently, the packaging technique is not compatible with semiconductor wafers having standard dicing line widths, and requires customizing measures to ensure the wider than usual dicing line widths.

FIG. 5 illustrates a schematic cross-sectional view in one embodiment of the electronic package disclosed in co-pending Parent application Ser. No. 10/692,816. The electronic package 401 is shown assembled onto a printed circuit board (PCB) 402. The package 401 includes a transparent substrate 404 which extends over a photo-image sensor die 406 (disposed as shown as facing the substrate 404). Light L then reaches the photo-image sensor die 406 through the substrate 404.

A set of solder joints 408 are used between the photo-image sensor die 406 and substrate 404 to form electrical interconnections. A larger set of solder joints 420 are used outside and about the photo-image sensor die 406 to make electrical interconnections between the electronic package 401 and the PCB 402.

This unique electronic packaging approach offers numerous advantages over other packaging techniques. The resulting package size may be minimized even further, however, by reducing in size, and/or altogether removing at least some of the larger solder joints 420.

Accordingly, it is an object of the present invention to provide a highly minimized package size for photo-sensing devices to accommodate hand-held applications like cellular phone cameras. Another object of the present invention is to provide a lower cost package for photo-sensing devices.

SUMMARY OF THE INVENTION

Briefly described, and in accordance with a preferred embodiment thereof, the present invention relates to a structure of an electronic package of photo-sensing semiconductor devices and the method of fabrication and assembly thereof.

In accordance with the present invention, a plurality of sensing portions are formed on a semiconductor wafer then separated to form a plurality of sensing dice. A plurality of solder bump pads are provided on a photo-sensing semiconductor wafer to accommodate the subsequent formation of solder joints thereon. Preferably, an under bump metallurgy (UBM) technique known in the art may, for example, be employed in that regard.

A substrate is fabricated separately. This substrate may be configured, for example, as a circular wafer or a rectangular panel. This substrate has defined thereon a plurality of unit substrates in much the same manner as the semiconductor wafer having a plurality of dice. Each unit substrate becomes an assembly portion which, together with the sensing portion, forms an electronic package after fabrication and assembly are complete. The material for the substrate is preferably transparent at the wavelength of light where the photo-sensing devices respond. One example of such material is a suitable glass material having sufficient transparency for photo-sensing devices in the visible portion of the spectrum.

The fabrication of this substrate includes forming at least one patterned metal layer to make solder wettable pads and interconnection lines between the solder wettable pads by deposition and patterning using any suitable measures known to persons versed in semiconductor fabrication art. These solder wettable pads are grouped into at least three sets. The solder wettable pads in the first set are relatively smaller and correspond to the solder bump pads of the photo-sensing dice for making interconnections to those photo-sensing dice. The solder wettable pads in the second set are relatively larger and are used for making interconnections of the resulting package itself to external circuitry, such as a flexible film member. The solder wettable pads in the third set are used for making interconnections in the package for components other than the photo-sensing die, such as decoupling capacitors and the like.

Also, the substrate includes at least one patterned passivation layer over the patterned metal layer for protecting the interconnection lines formed thereby. This patterned passivation layer has openings at the solder wetable pads.

Solder bumps (or caps) are formed on all the solder wettable pads of the substrate. This process typically includes application of solder material onto the solder wettable pads, and heating the substrate and photo-sensing semiconductor wafer up to a characteristic reflow temperature of the solder material to cause its melting and wetting down onto the solder wettable pads of the substrate.

The diced photo-sensing dice having the UBM pads are then mounted onto the substrate using, preferably, a suitable flipchip mounting technique known to persons versed in semiconductor manufacturing art. The process includes serial pick-and-flip-and-place of each photo-sensing die onto a predetermined location of the substrate until each unit substrate has all the necessary photo-sensing dice placed thereon. This pick-and-flip-and-place process typically includes flux application onto the soldering area. Passive or other secondary components are mounted, if necessary, onto predetermined locations of the substrate either before or after the flipchip mounting. The substrate is then heated to a characteristic reflow temperature of the solder material for making interconnections between the substrate and the photo-sensing dice, and between the substrate and passive components, if any.

Dicing of the large substrate follows thereafter to separate the unit substrates. Each substrate unit may then be picked-and-placed into a preferred packing media such as tray or tape and reel.

Assembly of a module incorporating the resulting electronic package generally includes two main processes. One main process is that of attaching a housing to the substrate, much as with a COB camera module. The other main process is making the required electrical interconnection between the electronic package and outer circuitry elements, such as a flexible film member.

The module is highly minimized in size to chip scale levels by, among other things, eliminating at least some of the solder joints outside and about the module's photo-image sensor die. The resulting electronic module may provide a lower cost solution by eliminating the need for a PCB which is necessary in COB modules.

DETAILED DESCRIPTION OF THE PREFERRED EMBODIMENTS

Figure 1A:
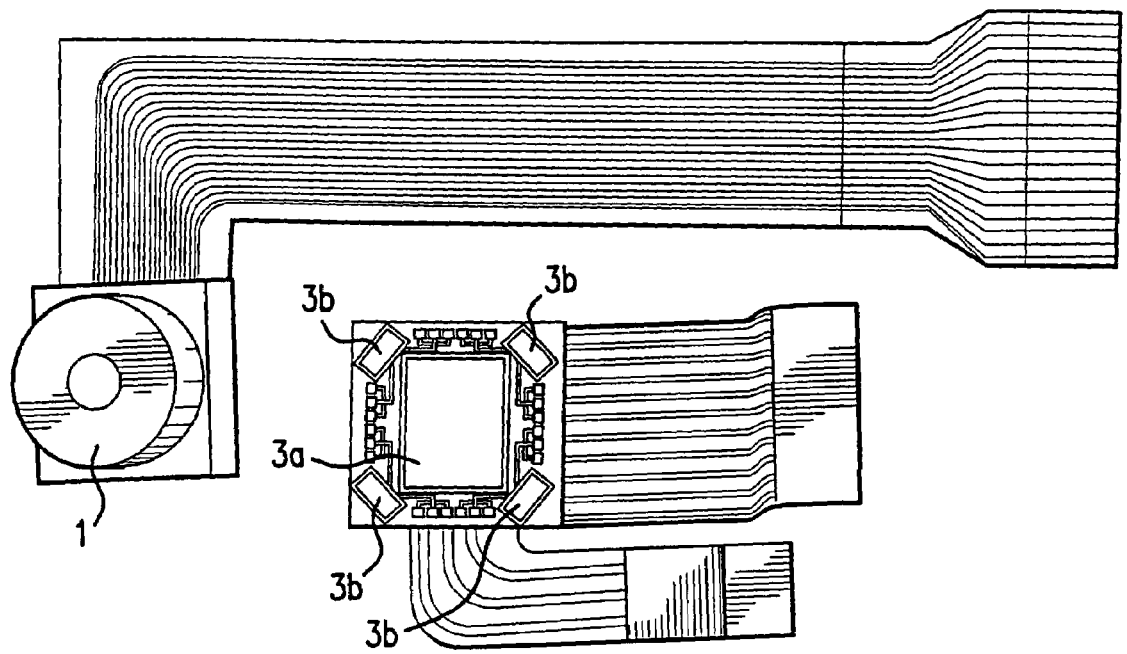
FIG. 1A is a set of top plan views of typical cameral modules known in the art.
Figure 1B:
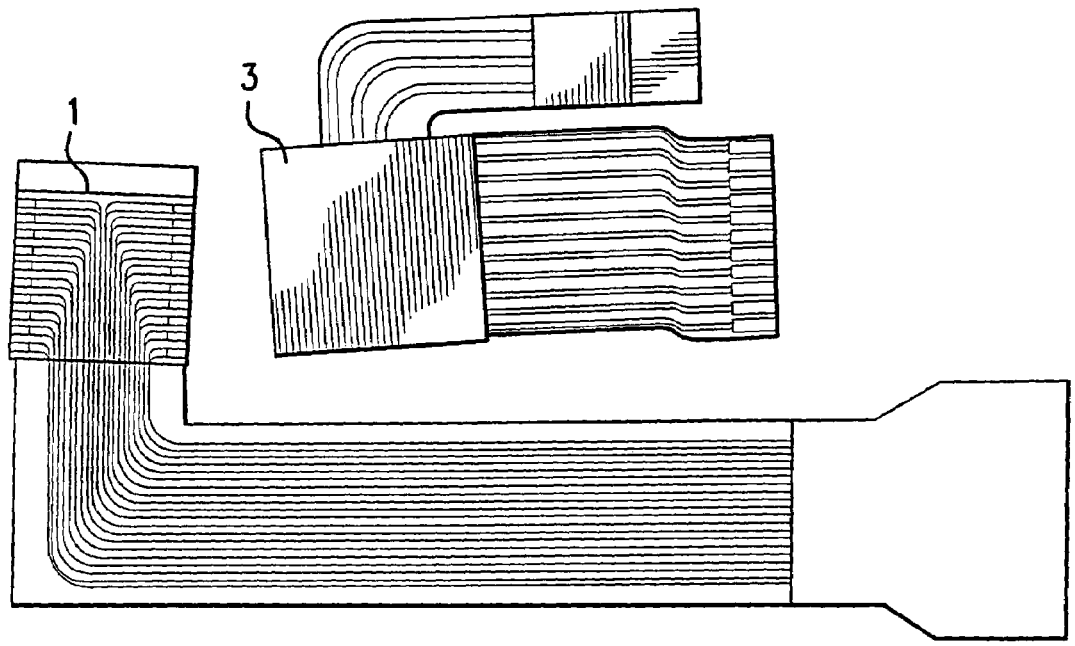
FIG. 1B is a set of bottom plan views of the cameral modules shown in FIG. 1A.
Figure 2:
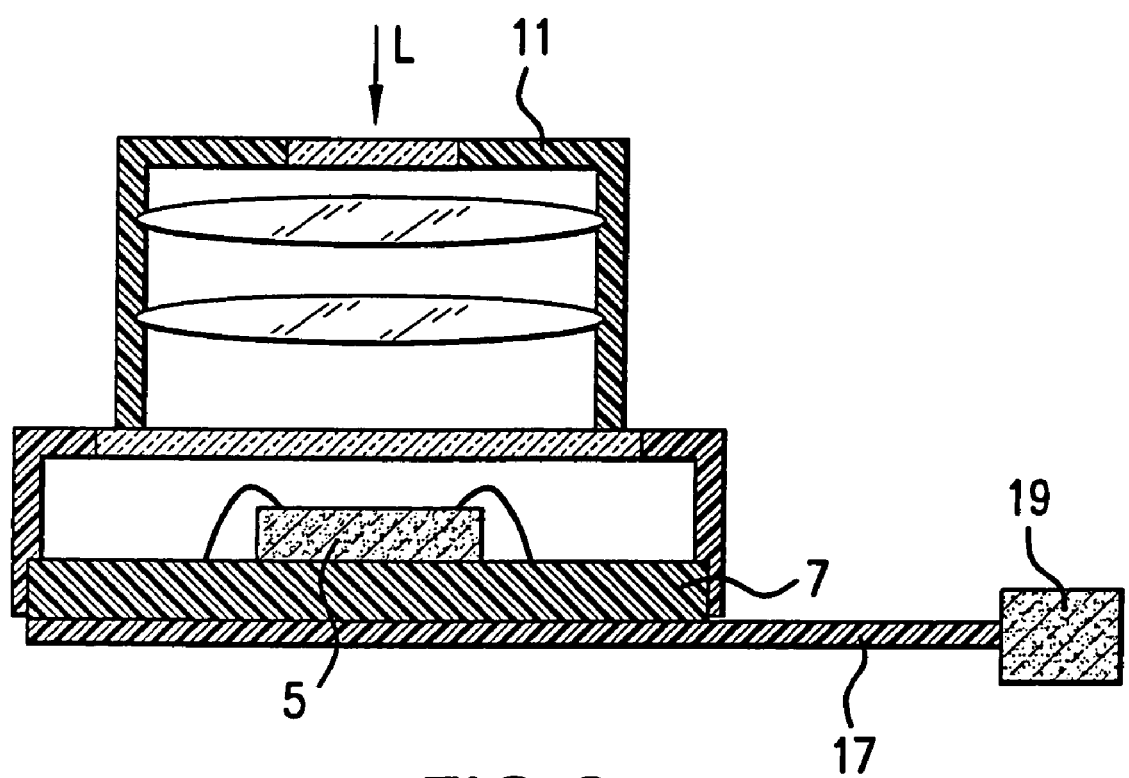
FIG. 2 is a schematic cross-sectional view of a chip-on-board type camera module known in the art.
Figure 3:
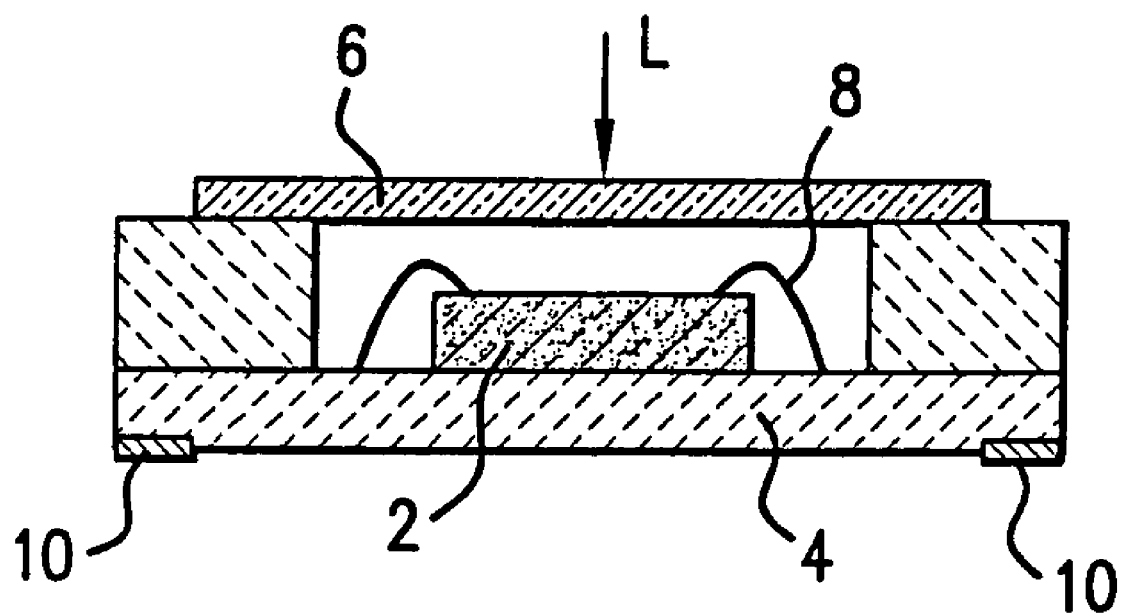
FIG. 3 is a schematic cross-sectional view of a typical CLCC photo-sensing device known in the art.
Figure 4:
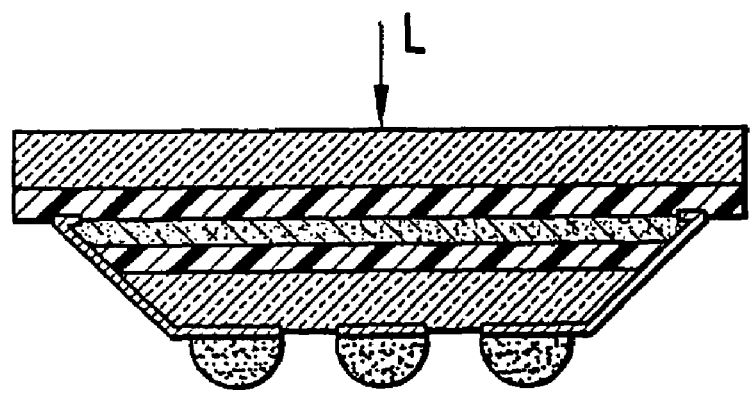
FIG. 4 is a schematic cross-sectional view of another photo-sensing device of a type known in the art.
Figure 5:
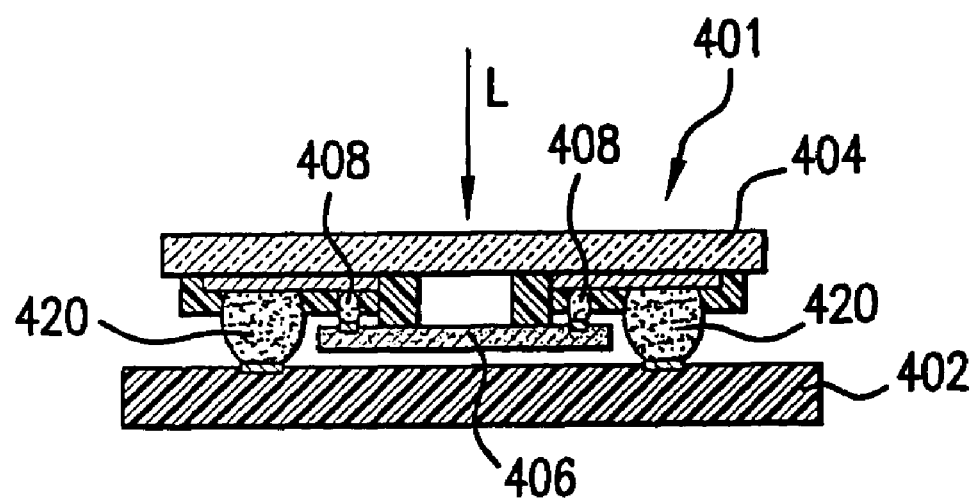
FIG. 5 is a schematic cross-sectional view of an exemplary photo-sensing device formed in accordance with the invention disclosed in co-pending application Ser. No. 10/692,816.

A photo-sensing semiconductor wafer has a plurality of dice, and each die has integrated circuitry formed on a front surface of the wafer, much as in other semiconductor wafers. Each die has a plurality of bonding pads. The wafer has a patterned passivation layer over the front surface for protecting the integrated circuitry underneath. The passivation layer has openings on said bonding pads. Each such photo-sensing die has at least one photo-sensing area on a front surface.

Wafer bumping is a well-known technique that has been widely used since its initial teaching, as reflected in U.S. Pat. No. 3,292,240 entitled "Method of Fabricating Microminiature Functional Components," assigned to IBM. A typical wafer bumping process includes at least one patterned metal layer for making solder bump pads connected to bonding pads on the wafer. Metallurgy used for solder bump pads is commonly referred to as under bump metallurgy (UBM) and typically utilizes a multilayered structure to provide multiple functions, such as good adhesion to bonding pad, good diffusion barrier against solder, and good wettability to solder (and oxidation protection if necessary).

UBM pads are formed over the wafer in accordance with a preferred embodiment of the present invention. Various techniques for depositing UBM are available, including sputtering, electroplating, electroless plating, and the like. While the present invention is not limited to any particular technique for UBM formation, electroless Nickel plating is a preferable technique for several reasons. First, electroless Nickel is a low cost technique for forming UBM, as it does not include high cost processes such as sputtering or photolithography steps. The second is that electroless Nickel tends to be a safer technique than others for forming UBM, especially where the photo-sensing semiconductor wafer is provided with color filters and a microlens over its final passivation layer. A sputtering process or chemicals used in metal etching can attack the color filter and microlens exposed over the final passivation layer, thereby degrading attainable performance.

The electroless Nickel technique preferably, though not necessarily, employed in accordance with a preferred embodiment of the present invention includes the application of thin emersion Gold on top of the Nickel to increase solderability. The Nickel thickness is optimally maintained. If too thin, it will not exhibit sufficient diffusion barrier characteristics. If too thick, the resulting electroless Nickel UBM induced residual stress may cause cracking or delamination of the underlying bonding pad metal. Typically, the thickness is maintained within the range of approximately 3-10 micrometers for most applications.

In accordance with a preferred embodiment of the present invention, the photo-sensing semiconductor wafers are formed preferably with only UBM pads, without any solder bumps apart from these pads. The solder bumps required for interconnection may be provided more efficiently on corresponding substrate units, as explained more clearly in following paragraphs. If necessary, however, solder bumps may be formed on the photo-sensing semiconductor wafers' UBM pads in alternate embodiments.

In that case, a predetermined amount of solder material is applied onto the solder bump pads. There are numerous ways to apply solder—electroplating, stencil printing, and the like. Several solder materials often used in wafer bumping—eutectic tin-lead, high lead (tin-lead solder having more than 80% lead in weight scale), and lead-free (typically tin based solder such as pure tin, tin-silver, tin-copper, tin-silver-copper, and the like).

This wafer bumping process also includes heating the wafer to a characteristic reflow temperature of the solder for causing connection of solder to the solder bump pads. Wafer bumping could optionally include at least one patterned passivation layer under the patterned metal layer, in accordance with the so-called "re-passivation" technique. Also, wafer bumping could optionally include interconnection metal traces between the bonding pads and the solder bump pads, in accordance with the so-called "redistribution" technique. This redistribution typically necessitates another patterned passivation layer for protecting the interconnection metal traces. Such various structures for wafer bumping are well known to persons versed in wafer bumping art.

Where a bumped wafer is used for making an electronic package for photo-sensing devices in accordance with the present invention, it is not limited to any specific structure, bumping technique, or solder material used in such wafer bumping. Stencil printing would be preferable for its low cost, however.

The determination of overall height for a solder bumped wafer is based upon a size-reliability balancing, as larger size tends to heighten solder joint reliability, though it may undermine compactness. The solder bump height of the photo-sensing wafer after wafer bumping (including UBM thickness) is preferably less than 100 micrometers.

Figure 6A:
FIG. 6A is schematic cross-sectional view of an undiced photo-sensing semiconductor wafer in one exemplary embodiment of the present invention, before processing.
Figure 6B:
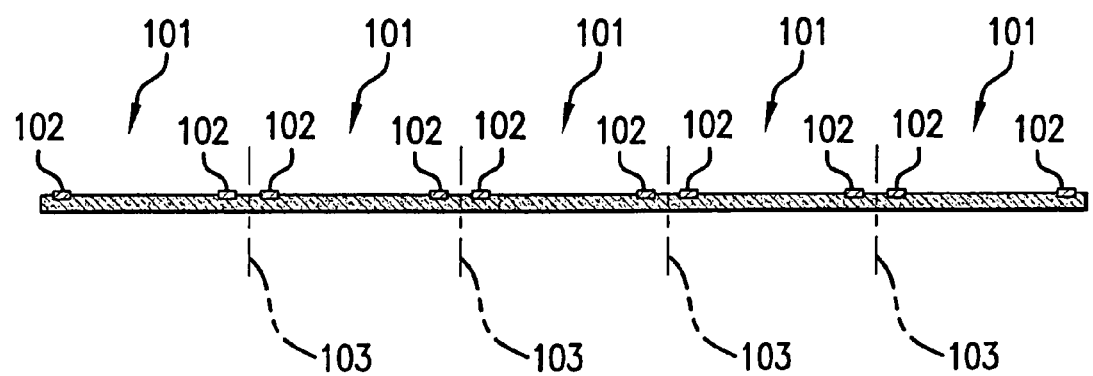
FIG. 6B is schematic cross-sectional view of an undiced photo-sensing semiconductor wafer in one exemplary embodiment of the present invention, after a patterned metal layer is applied.
Figure 6C:
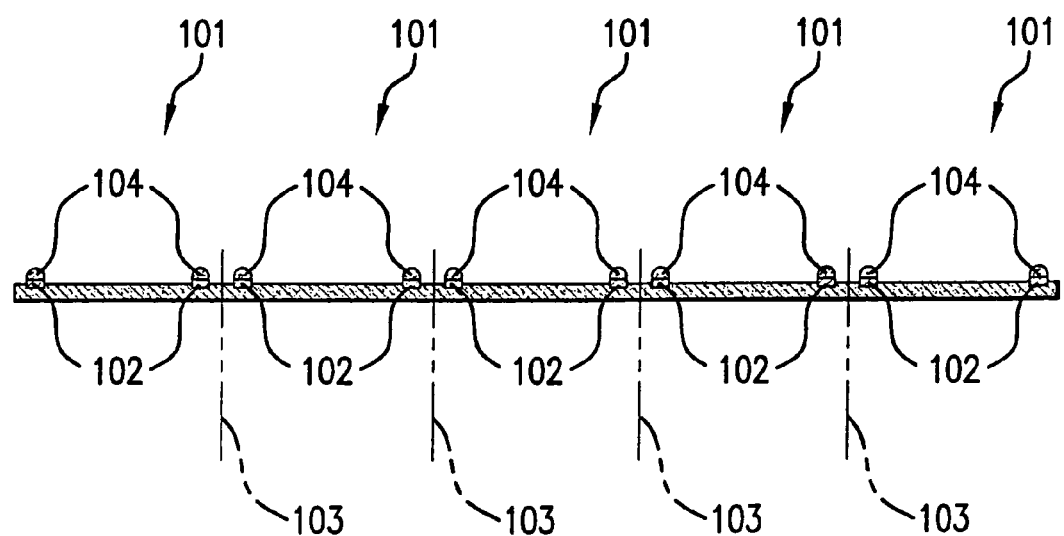
FIG. 6C is schematic cross-sectional view of an undiced photo-sensing semiconductor wafer in one exemplary embodiment of the present invention, after solder bumping.

FIGS. 6A-6C respectively illustrate for the given wafer bumping case schematic cross-sections of a photo-sensing semiconductor wafer 100 before processing, after applying a patterned metal layer to form a plurality of solder bump pads 102, and after solder bumping to form a plurality of solder bumps 104. Before or after UBM formation, or even after solder bump formation, the wafer 100 may be thinned out to a certain thickness, if necessary, by mechanical grinding using any suitable means known in the art of semiconductor manufacturing. The object of this thinning process would be to minimize the resulting modules height as much as possible in such compact hand-held applications as cellular phones. Preferably, the thickness of the wafer 100 after thinning is approximately 250-350 micrometers, and where sufficient resources are available, approximately 150-350 micrometers. The photo-sensing wafer is thereafter diced to separate each die 101 along dicing lines 103, again using any suitable means known in the art of semiconductor manufacturing.

A substrate is fabricated separately. This substrate is preferably in wafer or panel form having a large area sufficient to form a plurality of unit substrates in a batch process in a manner similar to that of a semiconductor wafer being made to have a plurality of dice. In general, the primary requirements for the substrate material include: transparency, mechanical rigidity, and chemical stability. The substrate material is selected to be one which is transparent to a certain wavelength or range of wavelengths, so as to transmit such light onto the photo-sensing device. Suitable substrate materials include, but are not limited to, glass, quartz, sapphire, silicon or other such materials. The choice of substrate material depends on the range of wavelengths of interest in a given application. Accordingly, photo-sensing devices operating at such wavelengths as those within the x-ray, ultra-violet, visible, or infrared spectra, for instance, may benefit from the present invention. Chemical resistance and mechanical stability are required to endure the temperature and various processing steps during fabrication, as well as to resist the environment during the resulting devices' expected life. One of numerous substrate materials that may be used for photo-sensing devices operating in the visible range of wavelengths is borosilicate glass. Depending on the requirements of the intended application, it is preferable to use a material having chemical and temperature stability, which may be obtained at reasonable cost, and which is available from numerous sources.

The substrate may be coated with at least one thin film layer on both surfaces to enhance light transmission therethrough. For example, an anti-reflection coating (ARC) or other suitable coating known to persons versed in the optical art may be applied. One purpose of this coating is to minimize the reflection loss of light over the entire light spectrum of interest.

Similarly, the substrate may be coated with at least one thin film layer on just one of its surfaces to enhance or reduce light transmission at a specific range of wavelengths. Such "optical filtering" may be effected using any suitable technique known in the art of optics. For example, an IR cut filter coating may be used in much the same manner that an IR cut filter glass is used in a COB camera module.

In accordance with a preferred embodiment of the present invention, a large wafer or panel of industrial glass is used for the substrate. Also in the preferred embodiment, the substrate is coated with at least one layer of thin film on either or both its front and rear surfaces to minimize reflection loss, or to enhance or reduce light transmission in the range of wavelengths of interest. Obviously, a thinner substrate minimizes the overall module height. If too thin, however, breakage may occur during fabrication and assembly. Preferably, a substrate having a thickness within the range between approximately 200-800 micrometers is used.

Referring to FIGS. 7A-10, at least one patterned metal layer 202 is applied on a front surface 204 of the substrate 200 for making solder wettable pads 206a, 206b (also 206c in FIG. 11) and interconnection lines 208 connecting such solder wettable pads 206a, 206b, 206c. Then, at least one patterned passivation layer 210 is applied on the patterned metal layer 202 for protecting the interconnection lines 208 formed thereby. The patterned passivation layer 210 is formed with openings at the solder wettable pads 206a, 206b, 206c.

The solder wettable pads 206a, 206b, 206c are grouped into three sets. The solder wettable pads 206a in the first set serve as solder bump pads for making electrical interconnections to a photo-sensing semiconductor die 101. The solder wettable pads 206b in the second set serve in making electrical interconnections of the resulting electronic package itself to external circuitry, such as a flexible film member, in forming a cellular telephone camera or other module. The third set of solder wettable pads 206c (FIG. 11) serve in making electrical interconnections to passive components such as decoupling capacitors.

Figure 7A:
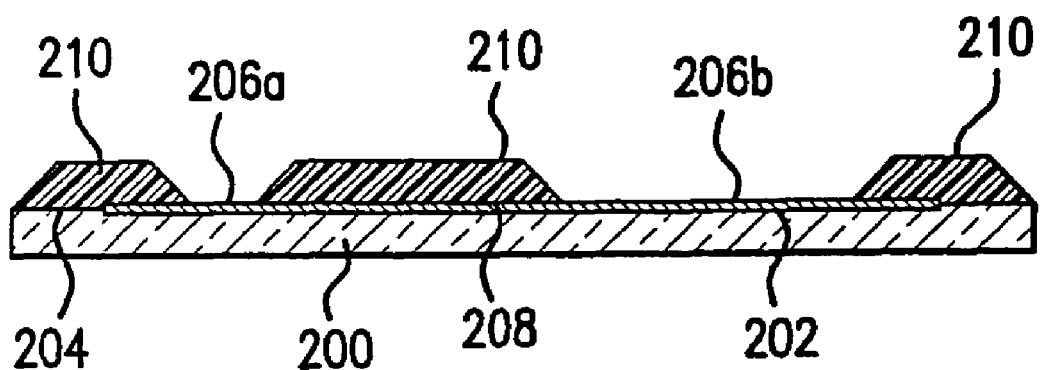
FIG. 7A is schematic cross-sectional view of a diced unit substrate at a certain stage of fabrication in one exemplary embodiment of the present invention.

If one patterned metal layer is sufficient to provide all the necessary routing of signal, power, and ground lines, a patterned multilayered thin film metal layer 202 and a patterned passivation layer 210 may be used as shown in FIG. 7A. The metal layer 202 then serves in providing both the solder wettable pads and interconnection lines.

Numerous solder wettable pad structures and materials are known in the art. One suitable example is copper (Cu) over titanium (Ti)-tungsten (W). In that example, the Ti-W component provides an adhesion and diffusion barrier while Cu provides a solder wettable layer. The Ti-W component may be approximately 1000-3000 Angstroms, with the Cu component being approximately 0.5-2 micrometers in thickness, depending on the required signal line resistance and solderability. Another suitable example is Cu over nickel (Ni)-vanadium (V) over aluminum (Al). In that example, the Cu component may be approximately 0.5-1 micrometer in thickness, with the Ni-V component at approximately 2000-5000 angstroms and the Al component at approximately 1-2 micrometers in thickness.

An advantage of using just one patterned multi-layered thin film layer is that it enables both the solder wettable pads and their required interconnections to be realized in one photolithographic patterning process. Nonetheless, the approach does have its drawbacks. One is that the sputtering process used in forming the multilayered thin film structure of the metal layer is usually high in cost. Another drawback is that the etching required for this multilayered thin film structure tends to be more complicated a process than that for a single metal thin film structure. Still another drawback is that a diffusion barrier layer is required in the interconnection metal line, typically in the form of a high resistance material which may produce undesirable residual effects during operation, and which may induce significant residual stress sufficient to undermine the interconnection metal line's reliability.

Figure 7B:
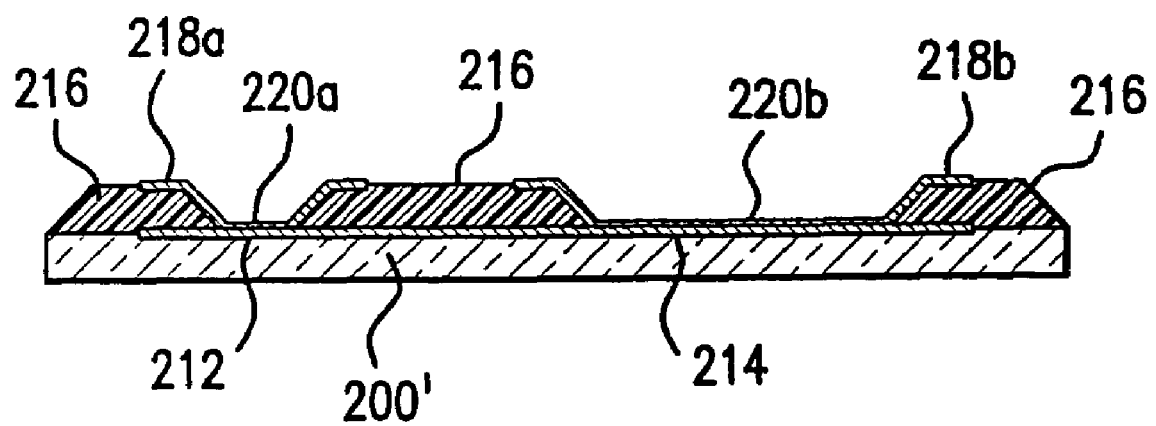
FIG. 7B is schematic cross-sectional view of a diced unit substrate at a certain stage of fabrication in an alternate exemplary embodiment of the present invention, utilizing multiple metal layers.

An alternative to the approach shown in FIG. 7A is the approach shown in FIG. 7B using two patterned metal layers and one patterned passivation layer therebetween. The first metal layer 212 forms the required interconnection lines, while the second patterned metal layer 218a, 218b forms the solder wettable pads, with the patterned passivation layer 216 protecting the interconnection lines. An approximately 1-2 micrometer thick layer of Al may be used for the first metal layer 212 to form the interconnection metal lines. Alternatively, an approximately 1-2 micrometer thick layer of Cu may be used in place of Al, but doing so may necessitate an adhesion/diffusion barrier metal like Ti or Ti-W underneath and, possibly, overtop, depending on the copper's interaction characteristics with the neighboring materials (for example, natural aluminum oxide on an Al surface provides effective self-protection for an Al metal trace, while copper oxide on a Cu surface is not quite as effective in this respect).

Other suitable solder wettable pad structures and materials may be used in accordance with the present invention. They include not only the single multilayered thin film metal approach described in preceding paragraphs, but also the use of electroless Nickel. It may be preferable in many applications to use electroless Nickel to form the second patterned metal layer, in particular, as it often represents a lowest cost option for forming solder wettable pads.

An advantage of using two separate metal layers as shown in FIG. 7B is that no diffusion barrier metal layer is required in the interconnection metal line. Hence, the potential problems due to a diffusion barrier metal layer's high electrical resistance and the high residual stress it induces are avoided. The approach, however, may require additional sputtering and photolithography processes to form the two patterned metal layers, which tends to drive fabrication costs upwards.

If more than one metal interconnection layer is ultimately necessary to provide sufficient routing of all required signal, power, and ground lines, only the final metal layer serves to provide solder wettable pads. The underlying metal layers provide the necessary interconnection lines. For these underlying interconnection lines, an approximately 1-2 micrometer thick layer of Al is a suitable option. A Cu layer of comparable 1-2 micrometer thickness may also be a suitable option, but it may require an adhesion/diffusion barrier metal underneath and/or overtop, depending on its adhesion and diffusion characteristics relative to the neighboring passivation material, as described in preceding paragraphs.

The final metal layer may serves to provide both interconnections and solder wettable pads, as in the one metal layer case of FIG. 7A. Alternatively, the final metal layer may serve to provide just the solder wettable pads, as shown in the two metal layer case of FIG. 7B. Each multilayered thin film metal layer employed is preferably deposited sequentially by sputtering without vacuum interruption between each metal layer's deposition, such that oxidation or contamination at the interfaces between metal layers is avoided.

The patterning of sputtered metal layers may be accomplished using any suitable process known in the art. Typically, the patterning process includes the steps of applying a photo-resist layer, photo-defining the photo-resist layer, etching away selected portions of the exposed sputtered metal layer, then removing the photo-resist.

Passivation layer application between metal layers may also be accomplished by a suitable process known in the art. Preferably, a polymer dielectric material is used for the passivation layer, with a thickness preferably in the range of approximately 4-20 micrometers, which is a range of thickness typically employed in the wafer bumping or wafer level packaging industry. The patterned passivation layer is formed with the openings necessary to accommodate the required electrical interconnections between metal layers.

Other suitable techniques and approaches known in the art may be employed to form the patterned metal and passivation layers. The present invention is not limited to any particular choice of structure, technique, or materials used toward that end.

Upon formation of the metal and passivation layers, three sets of solder wettable pads are preferably formed upon each unit section of the given substrate. The first is a set of UBM pads for making electrical interconnections to the photo-sensing die. The second is a set of pads for making electrical interconnections to external circuitry, such as one or more flexible film members in cellular phone camera module applications. The third is a set of pads for making electrical interconnections to devices other than the photo-sensing die, if necessary, such as decoupling capacitors.

Figure 8:
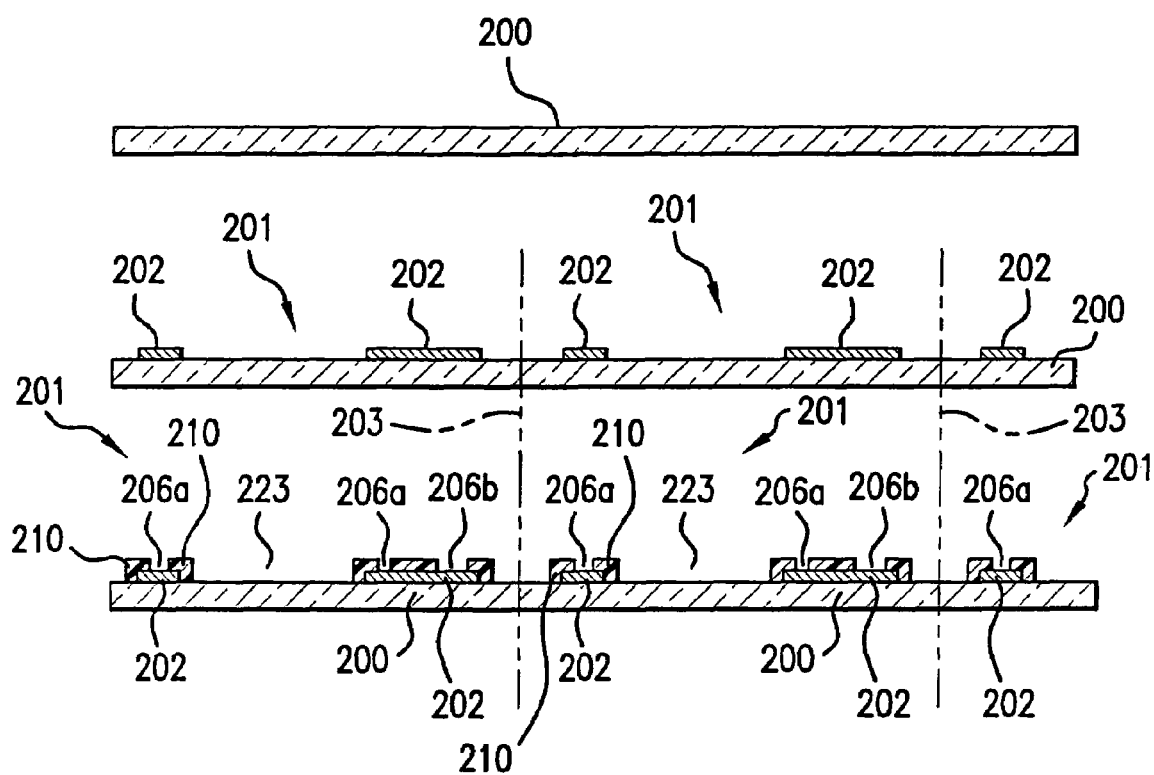
FIG. 8 is a series of schematic cross-sectional views illustrating an undiced substrate at certain stages of fabrication in one exemplary embodiment of the present invention.
Figure 10:
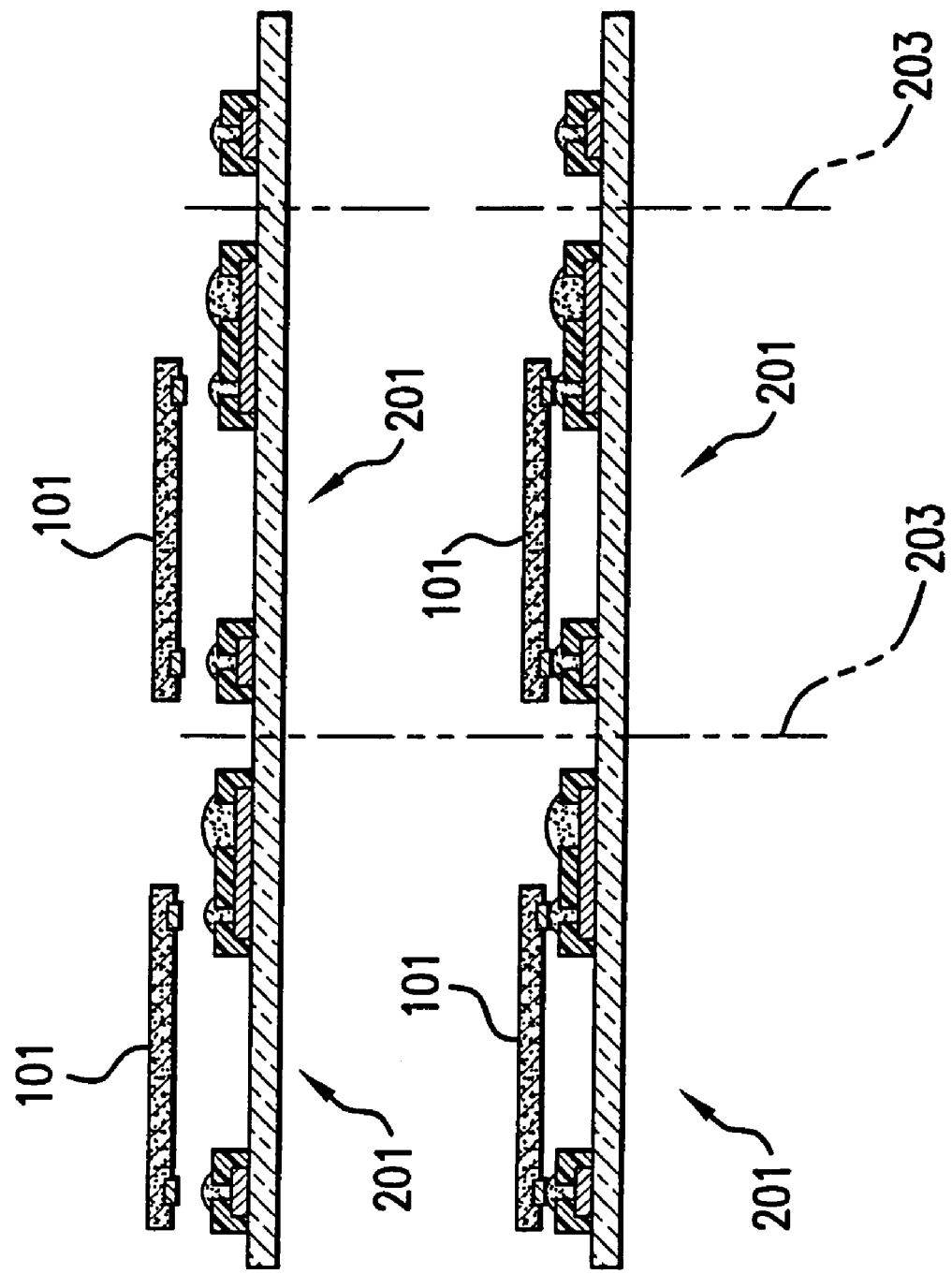
FIG. 10 is a series of schematic cross-sectional views illustrating a flipchip assembly of photo-sensing dice onto an undiced substrate in one exemplary embodiment of the present invention.
Figure 11:
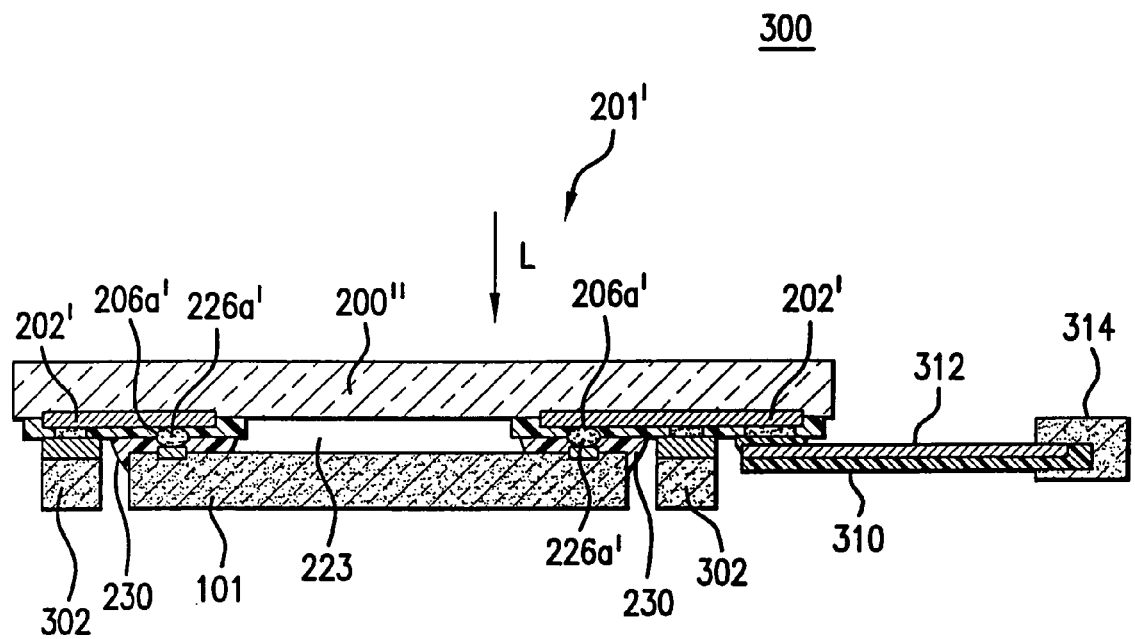
FIG. 11 is schematic cross-sectional view of a camera module formed in accordance with an exemplary embodiment of the present invention.

Referring to FIG. 8, there are shown schematic cross sectional views illustrating an undiced substrate 200 (in the form of a glass wafer) at different stages of fabrication. In the illustrated example, the substrate 200 is divided by dicing lines 203 into a plurality of unit substrates 201 each having a patterned multilayered thin film metal 202 and passivation 210 layers formed thereon to define first and second solder wettable pads 206a, 206b. For clarity, no solder wettable pads 206c of a third set (for connection of secondary components, such as shown in FIG. 11) are shown in the illustrative example of FIGS. 8-10.

Figure 9:
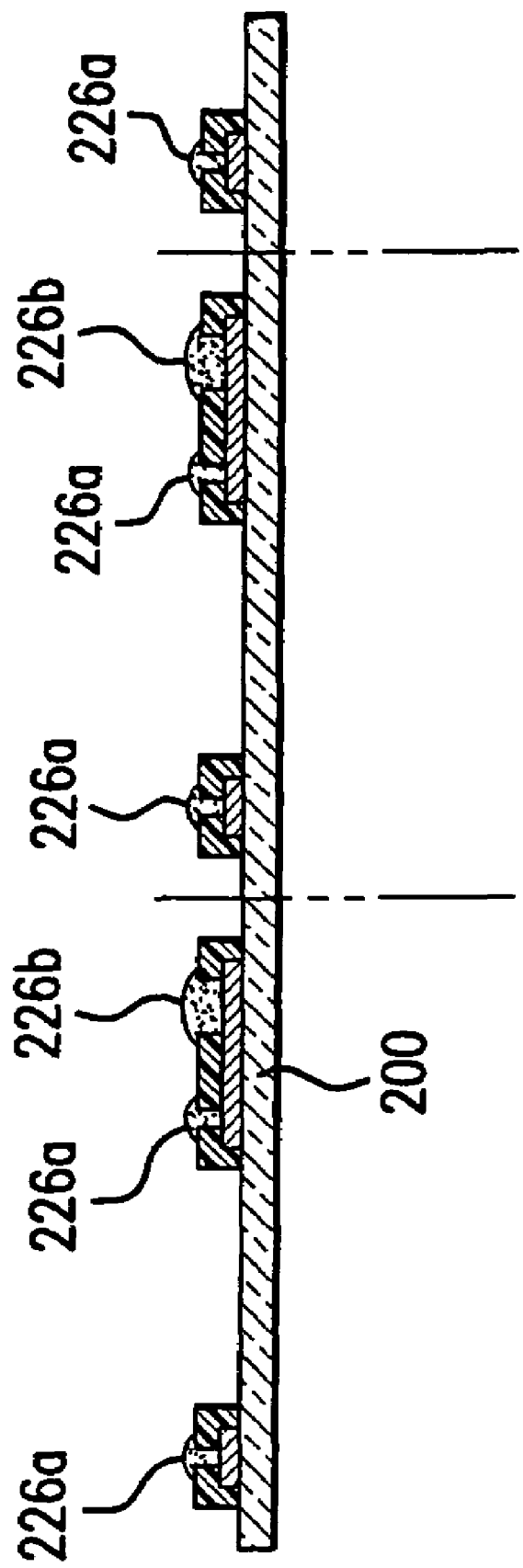
FIG. 9 is a cross-sectional view illustrating an undiced substrate at a certain further stage of fabrication in one exemplary embodiment of the present invention.

As illustrated in FIG. 9, solder bumps (or coatings) 226a, 226b are mounted at once on the first and second solder wettable pads 206a, 206b of all unit substrates 201. In a preferred embodiment, solder paste is preferably applied over each solder wettable pad 206a, 206b by stencil printing or other suitable means known in the art for applying solder material onto solder wettable pads. The resulting substrate structure is thereafter heated to a characteristic reflow temperature of the solder material for melting the solder paste to wet down onto the respective solder wettable pads 206a, 206b. Again, the third set of solder wettable pads 206c are omitted from the illustration for clarity.

There are numerous solder materials that may be used in accordance with the present invention. Eutectic tin-lead solder is a commonly used material. Lead-free solders such as pure tin, tin-silver, tin-copper, and tin-silver-copper are likely to be more widely used in the future because of generally tightening regulations to eliminate the use of lead in the semiconductor industry. High lead solders having more than 80% of lead in weight scale is a common solder material for high temperature applications because it tends to have higher melting temperatures and yields less consumption of diffusion barrier in solder bump pads. The present invention is not limited to the use of any particular solder materials.

Once the substrate 200 is fabricated to form a plurality of unit substrates, or assembly portions, 201 as described above, the photo-sensing dice 101 forming the sensing portions are mounted on the assembly portions 201 of the substrate 200, preferably by use of a suitable flipchip assembly process known in the art. Each assembly portion 201 is at this point equipped with appropriately positioned solder bump pads 226a formed at its first set of solder wettable pads 206a, obviating the need to form any solder bump pads on the photo-sensing dice 101 themselves. Consequently, the photo-sensing dice 101 need only be equipped with corresponding UBM pads for connection to these solder bump pads 102 (FIG. 10). Of course, if solder bumps are alternatively provided on the UBM pads of the photo-sensing dice 101, the solder bump pads 226a at corresponding solder wettable pads 206a may be partially or wholly obviated.

As FIG. 10 schematically illustrates, the flipchip assembly process includes pick-and-flip-and-place of each photo-sensing die 101 onto predetermined locations of each unit substrate 201 of the substrate 200 until all appropriate unit substrates 201 are populated with their necessary photo-sensing semiconductor dice 101. Multiple photo-sensing dice 101, of same or different kinds, may be mounted on one unit substrate 201. Other non-photo-sensing, active and/or passive dice (not shown, in the interest of clarity) may also be mounted on a unit substrate 201 along with the photo-sensing die 101 to form a multi-chip module. In forming such multi-chip modules, the multiple dice may be mounted concurrently, sequentially, or in suitably grouped combinations, depending on the requirements of the given application, in view of such practical factors as convenience, reliability, quality, cost, and the like.

The dice mounting operation preferably includes flux application onto the solder joint forming areas, so as to remove oxide layers from the joined surfaces, and to protect the joint forming areas from further oxidation during the solder joining process itself. Flux is preferably applied by a suitable "dipping" process, or by such other suitable dispensing processes known in the art. A rosin-based water soluble flux or other suitable material may be used in such flux application. With this material, however, an after-cleaning rinse using de-ionized water is required, for the resultant residue may otherwise be highly corrosive.

A so-called "no clean" flux which is organic-based may also be used, as may the so-called "no flow underfill" flux which is also an organic-based material. The "no flow underfill" material provides substantially the same fluxing action as the "no clean" material, but serves to better strengthen the given solder joints upon assembly.

The particular type of flux material used is not important to the present invention. Nonetheless, the "no flow underfill" material may be preferable in certain applications where good side wall protection and sealing of a sensing area are desired. Such flux material is for those reasons preferably, though not necessarily, employed in the illustrated embodiment for mounting the photo-sensing dice 101 to the substrate 200, whereby good side wall protection and effective photo-sensing area sealing are realized for the mounted dice. It is important during the mounting process to prevent the bleeding of any resin material into the photo-sensing areas, so as to keep such photo-sensing areas clean.

The substrate is then heated to a characteristic reflow temperature of the solder material for melting the solder and making solder joints 226a between the first set of solder wettable pads 206a of the substrate 200 and each photo-sensing die 101, and solder joints 226b between the second set of solder wettable pads 206b of the substrate and other external circuitry.

Where a flux material other than one which provides sufficient side wall protection and seal of the sensing area at reflow (like the "no flow underfill" material) is used, one or more additional processing steps may be necessary, depending on the given application's requirements, to provide sufficient side wall protection and seal. For example, dispensing of epoxy resin about the assembled photo-sensing dice, followed by such additional steps as oven curing and the like may be necessary.

Finally, the substrate 200 is diced along dicing lines 203 to separate the unit substrates 201. Each electronic package (having at least one unit substrate structure 201) which then results is picked-and-placed onto preferred packing media such as tray or tape-and-reel for packing and packaging.

Assembly of an electronic package thus formed in accordance with the present invention with a lens housing and flexible film may be carried out, for example, using much the same suitable means known in the art as for assembling a COB module. Generally, this includes two main assembly processes. One is to attach the lens housing onto the substrate by using epoxy in much the same manner as known in the art of COB module fabrication. The other is to make electrical connections between the electronic package and the flexible film, again in much the same manner as is known in the COB fabrication art, except that the flexible film is preferably attached directly to the electronic package rather than to a printed circuit board. For this process, a suitable SMT technique known in the art may be used. Alternatively, a suitable anisotropic or isotropic conducted film or adhesive technique known in the art for joining flexible film to substrates of various types may be used.

Referring now to FIG. 11, there is shown a schematic cross-sectional view of a cellular telephone camera module 300 formed in accordance with another illustrative embodiment of the present invention. For better understanding, the electronic package 201' in this illustrative embodiment is shown with the secondary components which had been omitted for clarity in the illustrative figures discussed in preceding paragraphs. These secondary components include, for example, decoupling capacitance members 302 connected using the appropriate techniques disclosed herein to respective metal layers 202' of the electronic package 201'.

Figure 12:
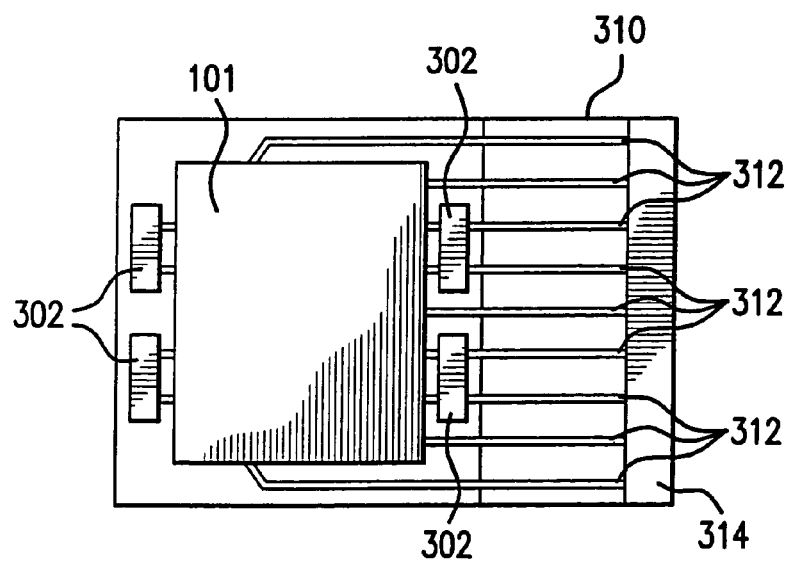
FIG. 12 is a bottom plan view of the cameral module shown in FIG. 11.

FIG. 12 shows a schematic bottom plan view of the module embodiment 300 shown in FIG. 11. In both FIGS. 11 and 12, the lens housing is not shown, in the interests of clarity; however, an exemplary configuration of the flexible film 310 provided with metal traces 312 is shown connecting the electronic package 201' to a connector 314. Also shown is the flux material 230 about each solder joint 226a' at a first solder wettable pad 206a' which provides side wall protection and sealing of the photo-sensing area 223, as described in preceding paragraphs.

Figure 13:
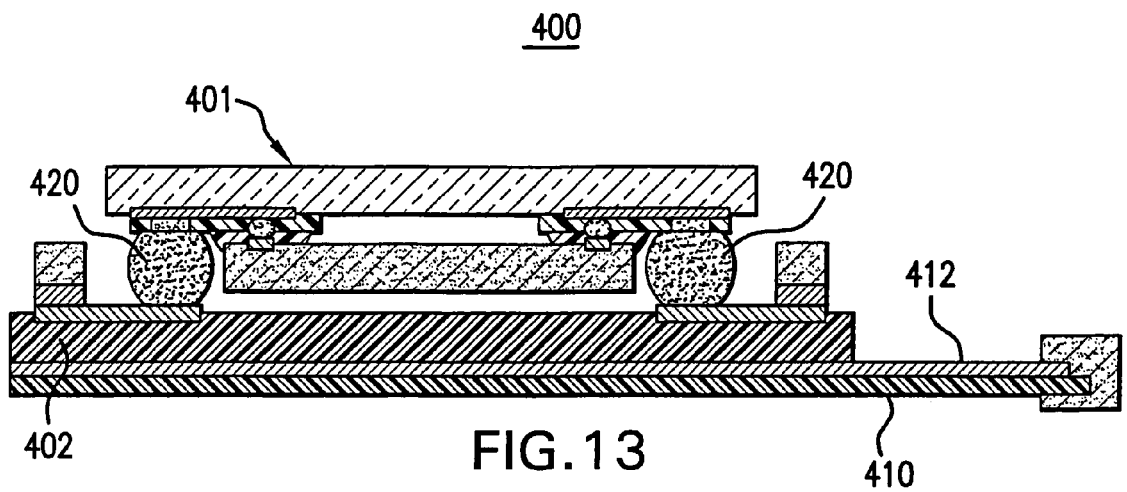
FIG. 13 is a schematic cross-sectional view of an exemplary camera module incorporating a photo-sensing device formed in accordance with the invention disclosed in co-pending application Ser. No. 10/692,816.

For comparison, a cellular telephone camera module 400 formed in accordance with an exemplary embodiment disclosed in co-pending application Ser. No. 10/692,816 is illustratively shown in the schematic cross-sectional view of FIG. 13. In module 400, the flexible film 410 is connected by its metal traces 412 to a printed circuit board 402 which, in turn, is connected to the electronic package 401 by outer solder joints 420. In contrast, the flexible film 310 in module 300 is connected by its metal traces 312 directly to the electronic package 201', obviating the need for any extraneous solder joints (such as joints 420) about the photo-sensing die 101 for interconnection to a supporting printed circuit board 402. In fact, the need for any supporting printed circuit board itself is obviated. This yields a simpler, more compact module structure which typically may be fabricated with less processing steps and potentially greater cost efficiency.

Figure 14:
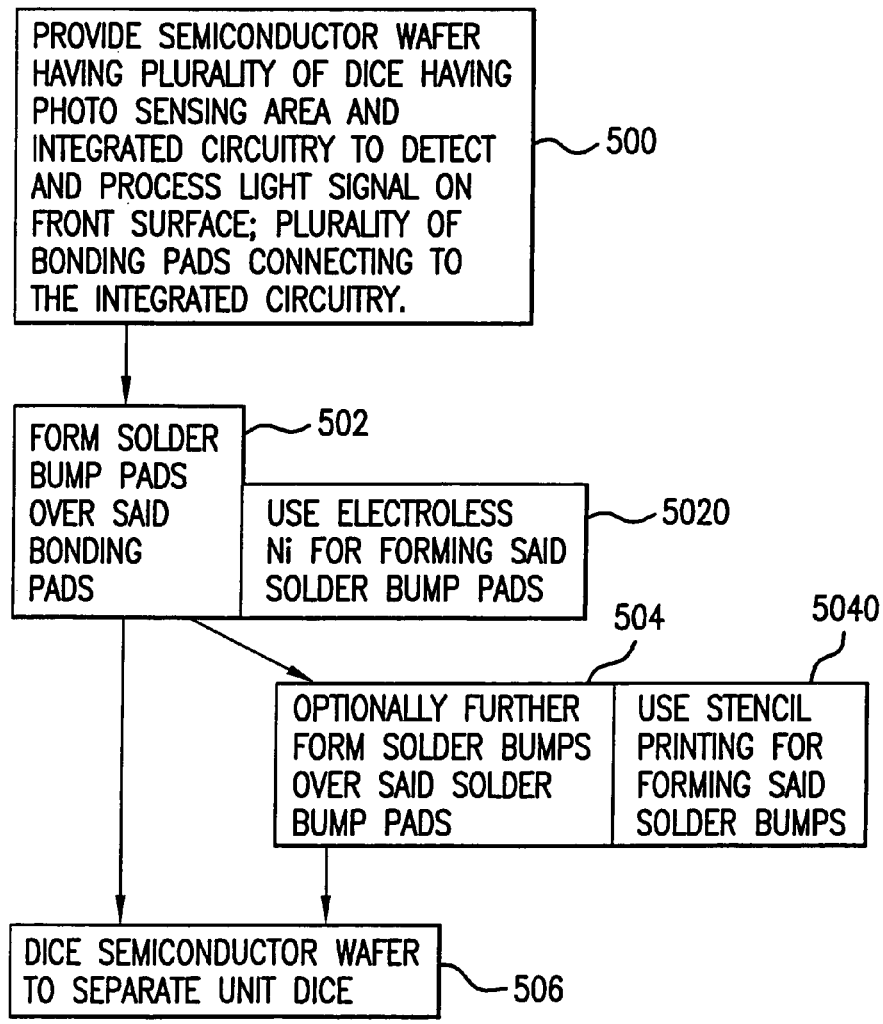
FIG. 14 is a block diagram illustrating the fabrication and assembly steps for photo-sensing dice formed in accordance with one exemplary embodiment of the present invention; and, FIG. 15 is a block diagram illustrating the fabrication and assembly steps for an electronic package formed in accordance with an alternate exemplary embodiment of the present invention.

Referring to FIG. 14, there is shown a block diagram illustrating fabrication steps for a photo-sensing wafer formed in accordance with one exemplary embodiment of the present invention. At step 500, a semiconductor wafer is provided on which a plurality of dice are defined, each with its own photo-sensing area and integrated circuitry for detecting and processing a light signal entering the photo-sensing area. A plurality of bonding pads are provided on the semiconductor wafer at appropriate positions to accommodate interconnections to the integrated circuitry.

At step 502, solder bump pads are formed over the bonding pads provided on the semiconductor wafer. Preferably, though not necessarily, an electroless Nickel technique is employed to form the solder bump pads, as indicated at block 5020. If the requirements of the given application necessitate, further solder bump pads may be formed, as indicated at block 504, over these solder bump pads formed at step 502 or 5020. In that case, a stencil printing technique is preferably, though not necessarily, employed to form these further solder bumps, as indicated at block 5040. At step 506, the dice so formed on the semiconductor wafer are separated into a plurality of unit dice.

Figure 15:
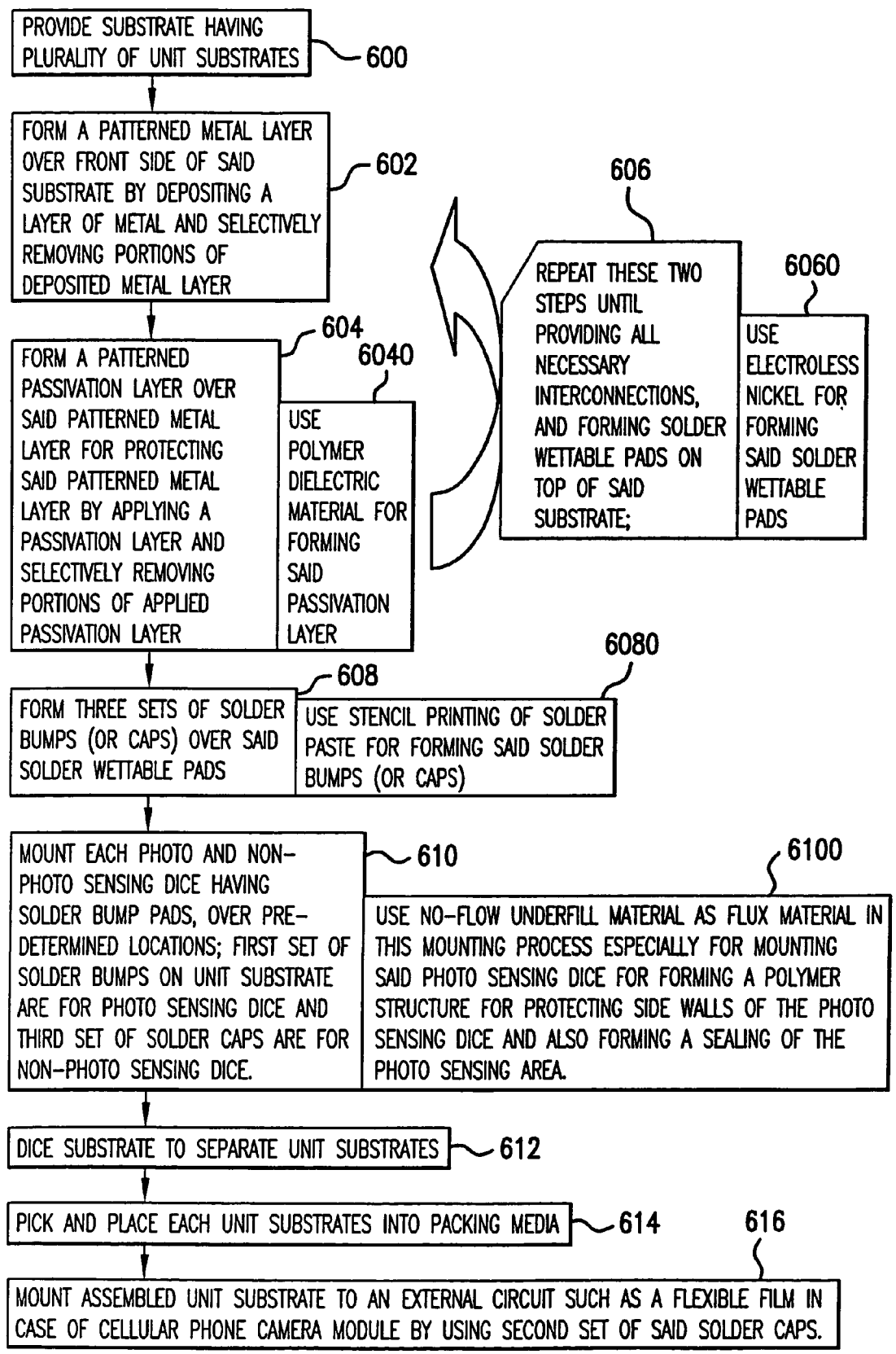

Referring next to FIG. 15, there is shown a block diagram illustrating the fabrication and assembly steps for an electronic package formed in accordance with one exemplary embodiment of the present invention. As with FIG. 14, certain preferred aspects are shown; however, numerous other variations beyond those specifically shown may be employed in accordance with the present invention.

At block 600, a substrate is provided on which a plurality of unit substrates is defined. A patterned metal layer is formed at block 602 over a front side of the substrate by depositing and selectively removing portions of the metal layer material. At step 604, a patterned passivation layer is next formed over the patterned metal layer for its protection by applying and selectively removing portions of the passivation layer material. Preferably, though not necessarily, a polymer dielectric material is used for the passivation layer, as indicated at block 6040. Steps 602 and 604 are repeated as necessary, as indicated at block 606, to form all the required interconnections and solder wettable pads on the substrate's surface. Preferably, though not necessarily, an electroless Nickel technique is used in forming the solder wettable pads, as indicated in block 6060. Preferably, at least three (3) sets of solder bumps (or caps) are formed over the solder wettable pads, as shown at step 608. One of the various suitable techniques that may be used in forming such solder bumps is the stencil printing of solder paste, as indicated at block 6080.

Thereafter, at step 610, the photo-sensing and any other non-photo-sensing dice are mounted at predetermined locations on the prepared substrate. Each photo-sensing and non-photo-sensing die is provided with appropriate solder bump pads for this process. On each unit substrate, a first set of solder bumps are used for interconnecting the photo-sensing die thereto, while a third set of solder bumps (or caps) may be used for interconnecting any non-photo-sensing dice. Preferably, though again not necessarily, a no-flow underfill material is used as the flux material in this mounting process, as indicated at block 6100. This material is especially suitable for use in mounting the photo-sensing dice, as it yields a polymer structure that serves to protect the side walls of the photo-sensing dice while sealing their photo-sensing areas.

Following this, the resulting substrate structure is diced at step 612 to separate its plurality of unit substrates. At step 614, the electronic package formed at each unit substrate is then picked and placed into the given packing media. Each electronic package is then mounted to external circuitry such as a flexible film member (in the case of a cellular telephone camera module application, for example) using a second set of solder caps, as indicated at block 616.

The unique package of the present invention is applicable to all types of photo sensors or photo detectors fabricated with various types of technologies such as CCD or CMOS. The present invention is applicable wherever area image sensors are used, such as in camcorders, digital still cameras, PC cameras, mobile phone cameras, PDA and handheld cameras, security cameras, toys, automotive equipment, biometrics, and the like. The present invention is also applicable to linear array image sensors such as those used in fax machines, scanners, bar code readers and scanners, digital copiers, and the like. It is equally applicable in packaging non-imaging photo-sensors such as single diode or four-quadrant diodes used in motion detectors, light level sensors, positional or tracking systems, and the like.

Although this invention has been described in connection with specific forms and embodiments thereof, it will be appreciated that various modification other than those discussed above may be resorted to without departing form the spirit or scope of the invention. For example, equivalent elements may be substituted for those specifically shown or described, certain features may be used independently of other features, and in certain cases, particular combinations of fabrication or assembly steps may be reversed or interposed, all without departing from the spirit or scope of the invention as defined in the appended claims.

What is claimed is:

1. A method of packaging a photo-sensing device comprising the steps of:
   (a) establishing at least one photo-sensing die defining a photo-sensing area at a forward surface thereof for photo-electronically transducing light within a predetermined range of wavelengths;
   (b) forming on said photo-sensing die a plurality of solder bump pads electrically coupled to said photo-sensing area;
   (c) establishing at least one unit substrate formed of a material substantially transparent to light within said predetermined range of wavelengths;
   (d) forming on said unit substrate at least one metal layer and at least one passivation layer adjacent thereto to define at least first and second interconnected sets of solder wettable pads;
   (e) placing said photo-sensing die in inverted manner over said unit substrate, said solder bump pads substantially aligning respectively with said first solder wettable pads; and,
   (f) forming a solder joint between said second solder wettable pad and external circuitry to interconnect said external circuitry to said unit substrate.

2. The method of packaging a photo-sensing device as recited in claim 1 wherein said step (f) includes forming said solder joint to join a flexible film member to said second solder wettable pad.

3. The method of packaging a photo-sensing device as recited in claim 2 wherein said second solder wettable pad is positioned adjacent said first solder wettable pad to be displaced from said photo-sensing die.

4. The method of packaging a photo-sensing device as recited in claim 1 wherein step (d) includes forming a plurality of said metal layers, an upper one of said metal layers being extending at least partially on said passivation layer and forming said first and second solder wettable pads, a lower one of said metal layers forming an interconnection line between said first and second solder wettable pads.

5. The method of packaging a photo-sensing device as recited in claim 4 wherein said upper metal layer includes an electroless Ni material.

6. The method of packaging a photo-sensing device as recited in claim 1 wherein a plurality of said photo-sensing dice are integrally defined on a wafer, said wafer being diced before step (d) for separation of said photo-sensing dice one from the other.

7. The method of packaging a photo-sensing device as recited in claim 1 wherein a plurality of said unit substrates are integrally defined on a substrate, said substrate being diced after step (d) for separation of said unit substrates one from the other.

8. The method of packaging a photo-sensing device as recited in claim 7 wherein a pick-and-flip-and-place operation is sequentially executed to place said photo-sensing dice respectively over corresponding ones of said unit substrates.

9. The method of packaging a photo-sensing device as recited in claim 1 wherein step (d) includes defining said unit substrate a third set of solder wettable pads offset from said first solder wettable pads for interconnection of at least one auxiliary electronic component thereto.

10. A method of packaging a photo-sensing semiconductor device comprising the steps of:
  (a) establishing at least one semiconductor die having at least integrated one photo-sensing area defined at a forward surface thereof for photo-electronically transducing light within a predetermined range of wavelengths;
  (b) forming on said semiconductor die a plurality of solder bump pads to be electrically coupled to said photo-sensing area;
  (c) establishing at least one unit substrate formed of a material substantially transparent to light within said predetermined range of wavelengths;
  (e) applying on said unit substrate at least one metal layer and at least one passivation layer adjacent thereto to define a plurality of laterally displaced first and second solder wettable pads, said second solder wettable pad being interconnected to at least one said first solder wettable pad, said passivation layer forming a plurality of first and second access openings aligned respectively with said first and second solder wettable pads;
  (f) forming at least one solder bump at each of said first solder wettable pads;
  (g) placing said semiconductor die in inverted manner over said unit substrate, said solder bump pads engaging respective ones of said solder bumps;
  (h) applying a polymer material about at least a portion of said photo-sensing die for side wall protection and seal of said photo-sensing area;
  (i) heating each said solder bump to a characteristic reflow temperature thereof to join said solder bump pads and said first solder wettable pads; and,
  (j) attaching a flexible film member to said unit substrate by a solder joint between said flexible film member and at least one said second solder wettable pad.

11. The method of packaging a photo-sensing semiconductor device as recited in claim 10 wherein step (f) includes forming a plurality of third solder wettable pads for attaching passive electric components thereto.

12. The method of packaging a photo-sensing semiconductor device as recited in claim 10 wherein step (h) includes applying about said portion of said photo-sensing die a no flow underfill material to form a protective seal structure.

\* \* \* \* \*